(12) United States Patent
Baek et al.

(10) Patent No.: US 11,652,030 B2
(45) Date of Patent: May 16, 2023

(54) POWER MODULE AND RELATED METHODS

(71) Applicant: SEMICONDUCTOR COMPONENTS INDUSTRIES, LLC, Phoenix, AZ (US)

(72) Inventors: Jonghwan Baek, Bucheon (KR); JeongHyuk Park, Incheon (KR); Seungwon Im, Seoul (KR); Keunhyuk Lee, Suzhou (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 29 days.

(21) Appl. No.: 17/136,340

(22) Filed: Dec. 29, 2020

(65) Prior Publication Data

US 2022/0208654 A1 Jun. 30, 2022

(51) Int. Cl.
*H01L 23/495* (2006.01)
*H01L 23/00* (2006.01)

(52) U.S. Cl.
CPC .... *H01L 23/4951* (2013.01); *H01L 23/49575* (2013.01); *H01L 24/32* (2013.01); *H01L 24/48* (2013.01); *H01L 2224/32014* (2013.01); *H01L 2224/48091* (2013.01); *H01L 2224/48247* (2013.01); *H01L 2924/14* (2013.01); *H01L 2924/1531* (2013.01); *H01L 2924/181* (2013.01)

(58) Field of Classification Search
None
See application file for complete search history.

(56) References Cited

U.S. PATENT DOCUMENTS

| | | |
|---|---|---|
| 2002/0084519 A1 | 7/2002 | Choi et al. |
| 2004/0124539 A1 | 7/2004 | Yang et al. |
| 2007/0290301 A1 | 12/2007 | Lin |
| 2012/0112332 A1* | 5/2012 | Minamio ............ H01L 23/4334 438/122 |
| 2020/0266129 A1* | 8/2020 | Higashi ............. H01L 23/49531 |
| 2021/0125904 A1* | 4/2021 | Sugimachi .......... H01L 23/4334 |

* cited by examiner

*Primary Examiner* — Hung K Vu
(74) *Attorney, Agent, or Firm* — Adam R. Stephenson, Ltd.

(57) ABSTRACT

Implementations of semiconductor packages may include a substrate, a first die coupled on the substrate, and a lead frame coupled over the substrate. The lead frame may include a die attach pad. Implementations of semiconductor packages may also include a second die coupled on the die attach pad. The second die may overlap the first die.

18 Claims, 7 Drawing Sheets

POWER MODULE AND RELATED METHODS

BACKGROUND

1. Technical Field

Aspects of this document relate generally to semiconductor packages. More specific implementations involve power modules.

2. Background

Power modules may include one or more power semiconductor devices. The power semiconductor devices may include MOSFETs or IGBTs. Power modules may be used for power conversion equipment or inverters and may have an increased power density as compared to non-power module semiconductor packages.

SUMMARY

Implementations of semiconductor packages may include a substrate, a first die coupled on the substrate, and a lead frame coupled over the substrate. The lead frame may include a die attach pad. Implementations of semiconductor packages may also include a second die coupled on the die attach pad. The second die may overlap the first die.

Implementations of semiconductor packages may include one, all, or any of the following:

The die attach pad may be coupled directly over the substrate.

Implementations of semiconductor packages may include a third die coupled on the substrate.

The first die and the third die may be power die in the second die may be an integrated circuit die.

Implementations of semiconductor packages may include a wire bond between the first die and the second die.

Implementations of semiconductor packages may include a wire bond between the second die and the lead frame.

Implementations of semiconductor packages may include a substrate and a first die. The first die may include a first side and a second side opposite the first side. The first side may be coupled to and facing the substrate. Implementations of semiconductor packages may also include a third die coupled to the substrate and a lead frame coupled over the substrate. Implementations of semiconductor packages may also include at least two tie bars coupled between the lead frame and the substrate, a second die coupled on the die attach pad and over the second side of the first die, and a mold compound encapsulating the first die, the second die, and the third die.

Implementations of semiconductor packages may include one, all, or any of the following:

The mold compound may be between the second side of the first die and the second die.

Implementations of semiconductor packages may include a first wire bond between the first die and the second die and a second wire bond between the second die and the lead frame.

Implementations of semiconductor packages may include a third wire bond between the first die and the third die and between the third die and the lead frame.

Implementations of semiconductor packages may include a third tie bar coupled between the lead frame and the substrate. The at least two tie bars, the third tie bar, and the die attach pad may all be directly coupled to a same side of the lead frame.

Implementations of the semiconductor package may include a fifth die overlapping a fourth die.

Implementations of methods of forming semiconductor packages may include coupling a first die to a substrate, coupling a third die to the substrate, and coupling a lead frame over the substrate through a plurality of tie bars. The lead frame may include a die attach pad directly over the substrate. Implementations of methods may also include coupling a second die on the die attach pad. The second die may overlap the first die. The implementations of methods may also include encapsulating the first die, the second die, and the third die in a mold compound.

Implementations of methods of forming semiconductor packages may include one, all, or any of the following:

Implementations of methods of forming semiconductor packages may include bonding a wire between the second die and the first die.

Implementations of methods of forming semiconductor packages may include wire bonding a wire between the second die and the lead frame.

Implementations of methods of forming semiconductor packages may include clamping the lead frame prior to forming a wire bond between the second die and the lead frame.

Implementations of methods of forming semiconductor packages may include clamping the lead frame using a clamp that extends between the die attach pad and the substrate.

Implementations of methods of forming semiconductor packages may include wire bonding a wire between the first die and the third die and between the third die and the lead frame.

The first die and the third die may be power die and the second die may be an integrated circuit die.

The plurality of tie bars may include three tie bars directly coupled to a same side of the lead frame.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may include any shape, size, style, type, model, version, measurement, concentration, material, quantity, method element, step, and/or the like as is known in the art for such semiconductor packages, and implementing components and methods, consistent with the intended operation and methods.

Figure 1:
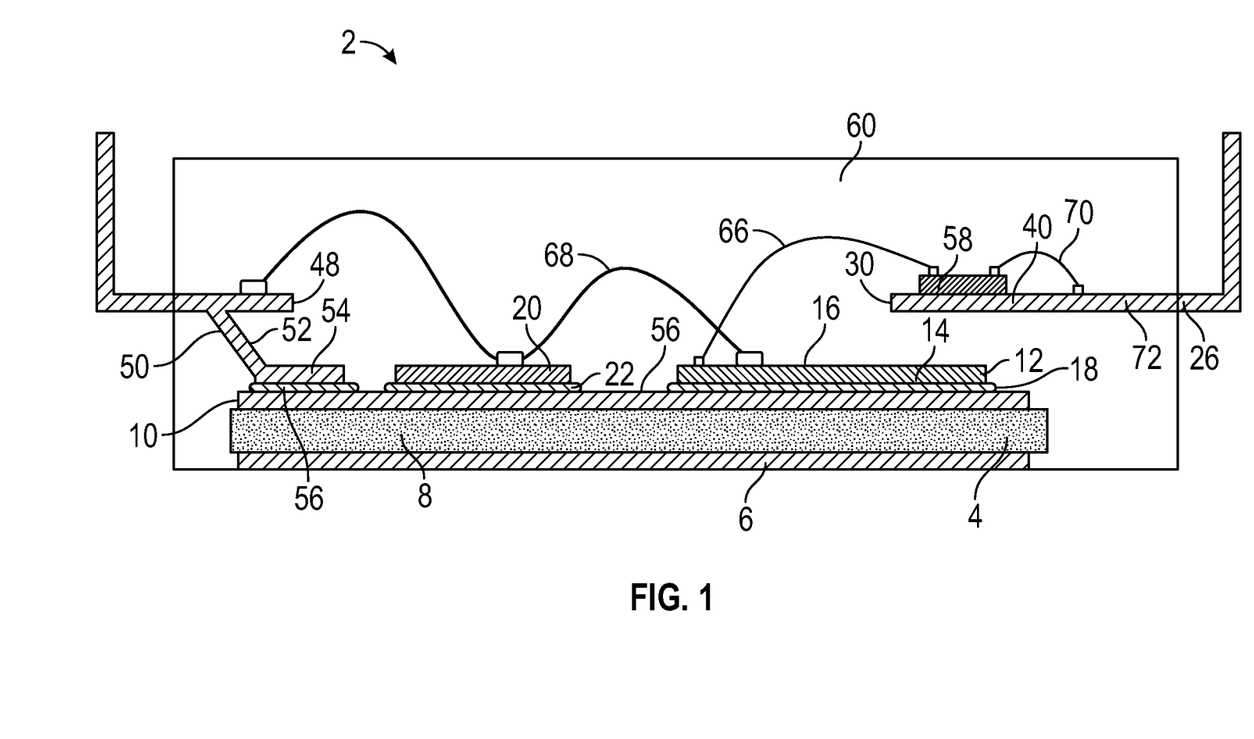
FIG. 1 is a cross sectional side view of an illustration of a semiconductor package.

Referring to FIG. 1, a cross-sectional side view of the semiconductor package is illustrated. In various implementations, the semiconductor package 2 may be a power module. While the implementations disclosed herein primarily refer to the semiconductor package as a power module, it is understood that in other implementations the semiconductor package 2 may be a type of semiconductor package different from a power module.

Figure 2:
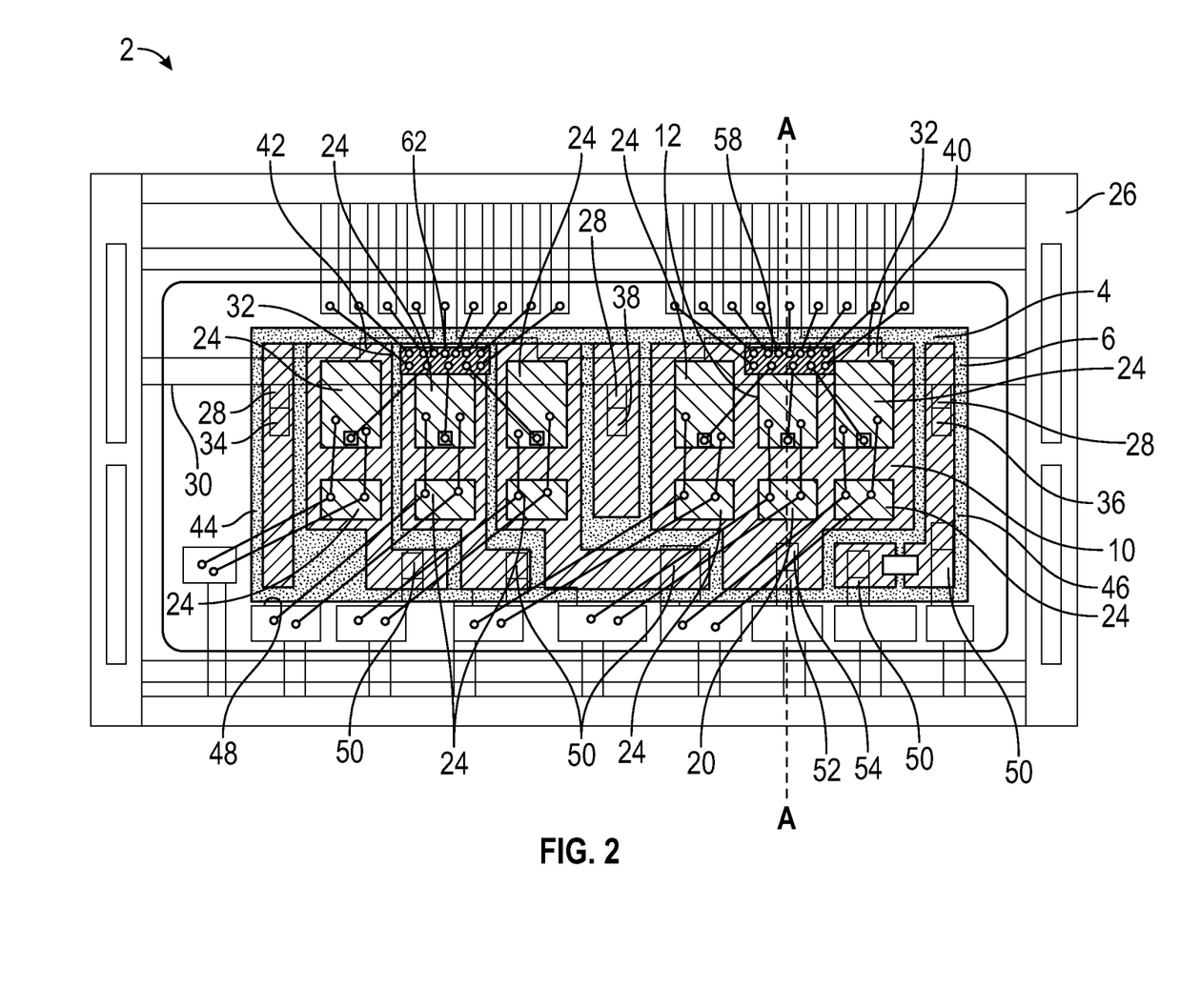
FIG. 2 is a top view of the semiconductor package of FIG. 1.

The semiconductor package 2 includes a substrate 4. In various implementations, the substrate 4 may include any or all of a first conductive layer 6, an insulating layer 8, and/or a second conductive layer 10. In particular implementations, the substrate 4 may be a direct bonded copper (DBC) substrate. In other implementations, the substrate 4 may be a type of substrate different from a DBC substrate. Referring to FIG. 2, a top view of the semiconductor package of FIG. 1 is illustrated. The cross-section of FIG. 1 is taken across line A-A of FIG. 2. As illustrated by FIG. 2, in particular implementations the second conductive layer 10 may be patterned.

Referring back to FIG. 1, the semiconductor package 2 includes a first die 12. The first die 12 includes a first side 14 and a second side 16. As illustrated by FIG. 1, the first side 14 is opposite the second side 16 and the first side 14 is facing the substrate. The first die 12 is coupled to and on the substrate and in various implementations, the first die 12 may be coupled directly to the substrate 4 through an adhesive 18. In such implementations, the adhesive 18 may include a solder material. The first die 12 may be a power die or other type of semiconductor die. In implementations including a power die, the first die may be, by non-limiting example, a metal-oxide-semiconductor field-effect transistor (MOSFET), an insulated-gate bipolar transistor (IGBT), or any other type of power die.

In various implementations, the semiconductor package 2 may include only a single die directly coupled on the substrate through an adhesive. In other implementations, and as illustrated by FIG. 1, the semiconductor package 2 may include an additional die 20 directly coupled on the substrate 4 through an adhesive 22. The adhesive 22 may include a solder material. The additional die 20 may be any type of die disclosed herein. While the cross-sectional view of FIG. 1 only illustrates two die directly coupled to the substrate 4, the semiconductor package may include more than two die directly coupled to the substrate. As illustrated by FIG. 2, the semiconductor package 2 may include one or more additional die 24 coupled on the substrate 4. The one or more die may be any type of die disclosed herein. In particular implementations, and as illustrated by FIG. 2, the semiconductor package 2 may include twelve die directly coupled on the substrate 4. In other implementations, the semiconductor package 2 may include more than 12 die or less than 12 die directly coupled on the substrate 4. Likewise, in other implementations the orientation of the die coupled on the substrate may differ from what is illustrated by FIG. 2.

Referring to FIGS. 1 and 2, the semiconductor package 2 includes a lead frame 26 coupled over the substrate 4. The lead frame 26 illustrated in FIG. 2 is illustrated as transparent in order to fully understand the relationship between the lead frame 26 and the remainder of the semiconductor package 2. The lead frame may include any type of metallic or conductive material. In various implementations, the lead frame 26 may be coupled to the substrate 4 through a plurality of the tie bars. As illustrated by FIG. 2, the lead frame 26 may be coupled to the substrate 4 through two or more tie bars 28 directly coupled to the side 30 of the lead frame 26 having one or more die attach pads 32. In particular implementations, as is illustrated by FIG. 2, the semiconductor package includes a first tie bar 34 coupled to a first end 44 of the substrate, a second tie bar 36 coupled to a second end 46 of the substrate opposite the first end of the substrate, and a third tie bar 38 directly coupled to a portion of the lead frame between the first die attach pad 40 and the second die attach pad 42. In other implementations, the semiconductor package 2 may not include the third tie bar 38 coupled directly to the portion of the lead frame 26 between the first die attach pad 40 and the second die attach pad 42. In still other implementations, the semiconductor package 2 may include more than three tie bars directly coupled to the side 30 of the lead frame 26 having the one or more die attach pads 32. In implementations having the third tie bar 38 directly coupled to the portion of the lead frame 26 between the first die attach pad 40 and the second die attach pad 42, the third tie bar 38 may support the lead frame and reduce lead frame bouncing during the formation of the semiconductor package 2 (including during the formation of any wire bonds or other electrical connections as well as during the attachment of the die to the die attach pad or pads of the lead frame).

As illustrated by FIGS. 1 and 2, the lead frame 26 may include a plurality of tie bars 50 coupling the second side 48 of the lead frame to the substrate 4. The second side 48 of the lead frame 26 is opposite the first side 30 of the lead frame. While FIG. 2 illustrates the semiconductor package 2 as having six different tie bars directly coupled to the second side 48 of the lead frame 26, in other implementations the semiconductor package may include more than or less than six tie bars directly coupled to the second side of the lead frame. As illustrated by FIGS. 1 and 2, the tie bars may include a bridge portion 52 configured to span the gap between the substrate and the lead frame and may also include a portion 54 configured to be directly coupled to the substrate through an adhesive. The adhesive 56 may be the same as any other adhesive disclosed herein. In various implementations, portion 54 may be considered a lead.

The lead frame 26 includes a die attach pad 40. The die attach pad 40 is directly coupled over the substrate 4. As illustrated by FIGS. 1 and 2, the die attach pad 40, and in turn the lead frame 26, overlap the substrate 4. As used herein, the term "overlap," as used in relation to the position of the lead frame 26 and/or die attach pads relative the substrate 4 and/or die coupled on the substrate, is used to describe how the lead frame 26 is directly over the face of the second conductive layer 10 and substrate 4. Similarly, the term "overlap," as used in relation to the die coupled on the die attach pads in relation to the substrate and/or the die coupled on the substrate, is used to describe how the die coupled on the die attach pad is directly over the substrate and the die coupled on the substrate. While FIGS. 1 and 2 illustrate the die attach pad 40 and the lead frame 26 overlapping a particular portion of the substrate 4, in other implementations the die attach pad 40 and the lead frame 26 may overlap a greater portion or a lesser portion of the substrate 4 than what is illustrated by FIGS. 1 and 2. As illustrated by FIGS. 1 and 2, the die attach pad 40 and the lead frame 26 also overlap the first die 12. While FIGS. 1 and 2 illustrate the die attach pad 40 as overlapping only a single die 12, in other implementations the die attach pad may overlap more than a single die.

Still referring to FIGS. 1 and 2, the semiconductor package 2 may include a second die 58 coupled on the die attach pad 40. In various implementations, the second die 58 may be directly coupled to the die attach pad 40. In such implementations, the second die may be directly coupled to the die attach pad 40 through an adhesive (which may be a solder) or any other coupling mechanism. In various implementations, the second die 58 may be an integrated circuit (IC) die. In other implementations, the second die 58 may be a power die or any other type of die. In various implementations, the second die 58 overlaps the first die 12. Inasmuch as the second die 58 overlaps the first die 12 and is coupled on the die attach pad 40 of the lead frame 26, the die attach pad 40, and in turn the lead frame 26, are positioned between the second die 58 and the first die 12. Further, as illustrated by FIG. 1, the mold compound 60 may also be between the second die 58 and the first die 12. While the second die 58 is illustrated as overlapping only the first die 12, in other implementations the second die 58 may overlap more die than just the first die 12.

Referring to FIG. 2, in various implementations the semiconductor package 2 may include an additional die 62 coupled on the second die attach pad 42. Just as the second die 58 overlaps the first die 12, the additional die 62 may overlap one or more of additional die 24 coupled on the substrate 4. While FIG. 2 illustrates the semiconductor package 2 as having two die coupled on the die attach pads of the lead frame and overlapping other die, in other implementations the semiconductor package may include more than two die coupled on die attach pads of the lead frame and overlapping other die. In still other implementations, the semiconductor package may only include a single die coupled to a die attach pad and overlapping another die.

In implementations having overlapping die, such as the second die 58 overlapping the first die 12, the semiconductor package 2 may be configured to allow for a larger substrate and in turn, larger die, which may be power die, coupled on the substrate. In particular implementations, the size of the substrate may be 31.6 mm×16.1 mm. In other implementations the substrate may be larger or smaller than 31.6 mm×16.1 mm.

Referring back to FIG. 1, the semiconductor package 2 may include a wire bond 66 between the second die 58 and the first die 12. In various implementations, the semiconductor package 2 may include a second wire bond 68 between the first die 12 and the additional die 20. In various implementations, the wire bond 68 may further extend from the one or more additional die 20 to the side 48 opposite the side 30 of the lead frame 26. In other implementations, a first wire bond may electrically connect the first die 12 and the additional die 20 and a second wire bond may electrically connect the additional die 20 to the second side 48 of the lead frame 26. In various implementations, a wire bond 70 may be formed between the second die 58 and the lead frame 26. In particular implementations, the wire bond 70 may be directly coupled to a lead post 72 of the lead frame 26.

In various implementations, the semiconductor package 2 may include wire bonds between any of the die directly coupled to the substrate, any die directly coupled to the lead frame, and/or the lead frame 26. Any of the wire bonds disclosed herein may include wire made from, by non-limiting example, gold, silver, aluminum, copper, any other conductive material, and/or any combination thereof. In other implementations, any or all of the wire bonds disclosed herein may be replaced by conductive clips or direct lead attachment mechanisms.

Still referring to FIGS. 1 and 2, in various implementations the semiconductor package 2 includes a mold compound 60 encapsulating the die, including the first die 12, the second die 58, and the additional die 20 of the semiconductor package 2. As illustrated by FIG. 1, the first conductive layer 6 of the substrate 4 may be exposed through the mold compound 60. In various implementations, the mold compound 60 may include an epoxy mold compound. In other implementations, the mold compound 60 may include a different type of mold compound.

In other implementations, the semiconductor package may include a housing encompassing the die and die attach pads of FIGS. 1 and 2 with a potting compound filling the housing and encapsulating the die and the die attach pads of FIGS. 1 and 2.

Referring to FIG. 2, the semiconductor package includes a particular topology. It is understood that other apologies including other types of die, other numbers of die, other orientations of die, other connection types between the die, and/or other connection patterns between the die may be used to form semiconductor packages having different topologies then the topology illustrated by FIG. 2.

Figure 3:
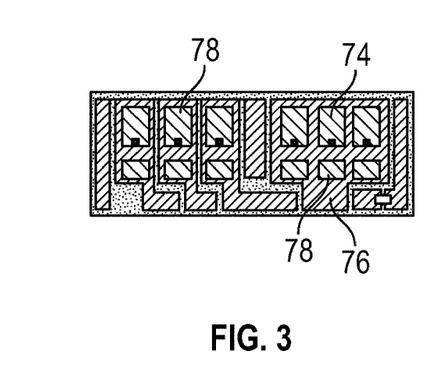
FIG. 3 is a top view of an illustration of a plurality of die coupled to a substrate.

Referring to FIGS. 3-7, a method of forming the semiconductor package of FIGS. 1 and 2 is illustrated. Referring specifically to FIG. 3, a top view of a plurality of die coupled to a substrate is illustrated. The method of forming the semiconductor package includes coupling a first die 74 to a substrate 76. The die 74 may be any type of die disclosed herein. Likewise, the substrate 76 may be any type of substrate disclosed herein. In various implementations, one or more additional die 78 may be coupled to the substrate 76. Any of the die 74 or die 78 may be directly coupled to the substrate 76 through an adhesive. The adhesive may be any type of adhesive disclosed herein. While FIG. 3 illustrates 12 different die coupled to the substrate 76, in other implementations more than 12 die or less than 12 die may be coupled on the substrate 76. Similarly, while FIG. 3 illustrates the die in a particular orientation, in other implementations different orientations of die coupled to the substrate may be formed.

Figure 4:
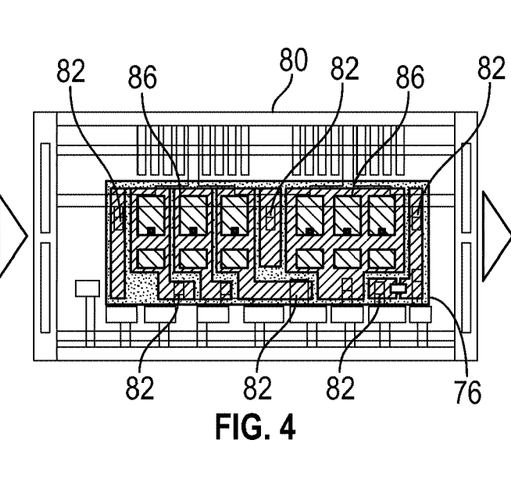
FIG. 4 is a top view of a lead frame coupled over the substrate of FIG. 3.

Referring to FIG. 4, a top view of a lead frame coupled over the substrate of FIG. 3 is illustrated. The lead frame 80 is illustrated as transparent in order to show the relationship of the lead frame to the substrate 76. The method of forming the semiconductor package includes coupling a lead frame 80 over the substrate 76 through a plurality of tie bars 82. The lead frame 80 may be the same as or similar to any other lead frame disclosed herein. The number of tie bars 82, the type of tie bars, or the position of tie bars, may respectively be the same as or similar to any number of tie bars, any type of tie bar, or any position of tie bars disclosed herein.

The lead frame 80 includes one or more die attach pad's 86. As illustrated by FIG. 4, both die attach pads overlap the substrate and one of the die attach pads overlaps the first die 74.

Figure 5:
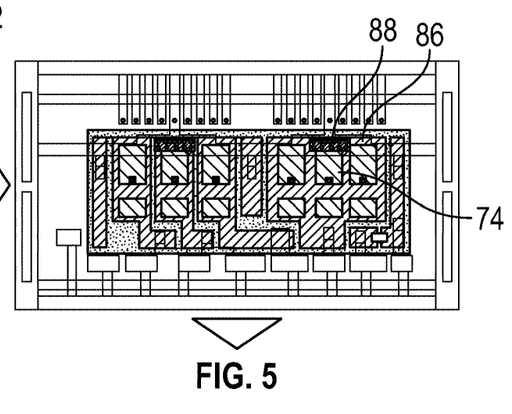
FIG. 5 is a top view of a plurality of die coupled to the lead frame of FIG. 4.

Referring to FIG. 5, a top view of a plurality of die coupled on the lead frame of FIG. 4 is illustrated. The method of forming a semiconductor package includes coupling a second die 88 on the die attach pad 86. In implementations having multiple die attach pads, the method may include coupling additional die to the additional die attach pads. In various implementations, the second die 88 and/or any additional die coupled on the die attach pads 86 may be IC die. In other implementations the second die 88 and/or any additional die coupled on the one or more die attach pad's 86 may be any other type of die disclosed herein. As illustrated by FIG. 5, the second die 88 may overlap the first die 74. In turn, the die attach pad and an empty gap may be between the second die 88 and the first die 74.

Figure 6:
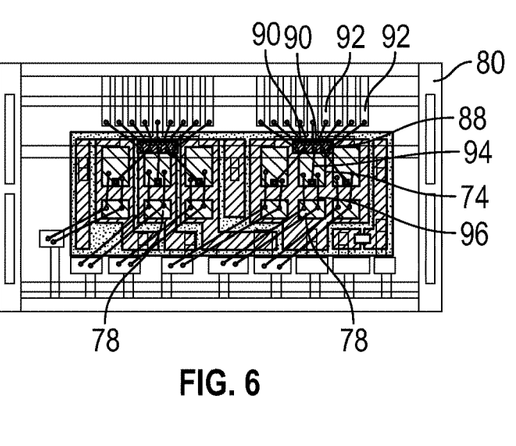
FIG. 6 is a top view of wire bonds between the lead frame and/or plurality of die of FIG. 5.

Referring to FIG. 6, a top view of wire bonds between the lead frame and/or plurality of die of FIG. 5 is illustrated. The method of forming the semiconductor package may include forming one or more wire bonds 90 directly between the second die 88 and the lead frame 80. In such implementations, the method may include forming the wire bonds 90 between the second die 88 and one or more lead posts 92 of the lead frame 80. In various implementations, the method may include forming one or more wire bonds 94 between the second die 88 and the first die 74. In various implementations the method may also include forming one or more wire bonds 96 between the first die 74 and additional die 78. In particular implementations the method may include extending the wire bond 96 from the one or more additional die 78 directly to the lead frame 80. In other implementations, multiple wire bonds may be used between the first die 74 and the lead frame 80. As illustrated by FIG. 6, in implementations having additional die coupled to additional die attach pads, the method may include forming wire bonds between the additional die coupled to the additional die attach pads and the lead frame 80 and/or the additional die 78 coupled on the substrate 76. The wire bonds formed may be the same as or similar to any other type of wire bond disclosed herein.

In other implementations, rather than using wire bonds as illustrated by FIG. 6, the method may include connecting any of the die and/or lead frame of FIG. 6 together through clips and/or direct lead attachment mechanisms.

Figure 7:
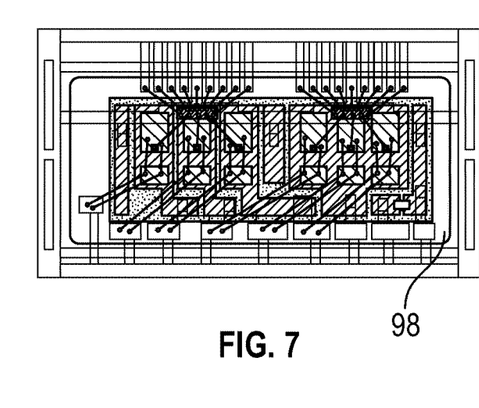
FIG. 7 is a top view of a mold compound covering portions of the lead frame, the plurality of die, and the substrate of FIG. 6.

Referring to FIG. 7, a top view of a mold compound covering portions of the lead frame, the plurality of die, and the substrate of FIG. 6 is illustrated. In various implementations, the method may include applying a mold compound over the die, the substrate 76, and portions of the lead frame 80 and encapsulating the die in the mold compound. The mold compound, including its relationship to the remainder of the semiconductor package, may be the same as or similar to any other mold compound disclosed herein.

Figure 8:
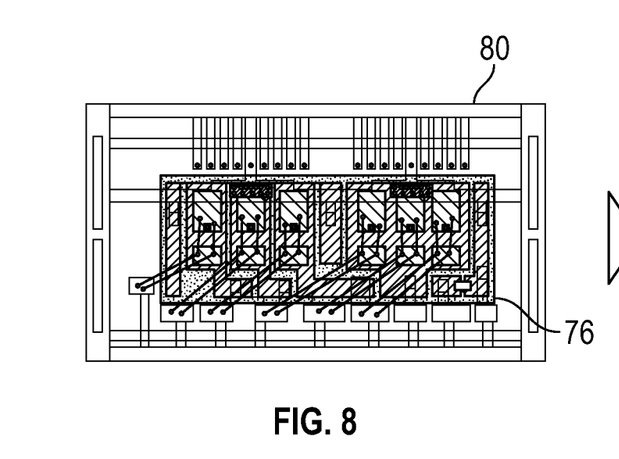
FIG. 8 is a top view of an illustration of a lead frame coupled over a substrate.
Figure 9:
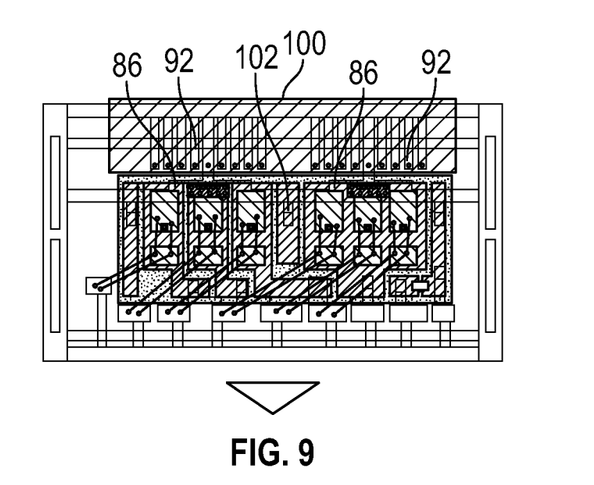
FIG. 9 is a top view of a bottom clamp placed under the lead frame of FIG. 8.
Figure 10:
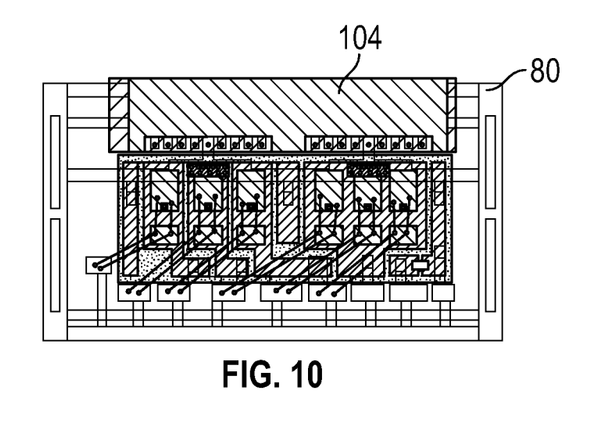
FIG. 10 is a top view of a top clamp placed over the lead frame of FIG. 9.

Referring to FIGS. 8 through 11, a method of forming the wire bonds between the second die 88 and the lead frame 80 of FIG. 6 is illustrated. Referring specifically to FIG. 8, a top view of a lead frame coupled over a substrate is illustrated. The method of obtaining the lead frame 80 coupled over the substrate 76 as illustrated in FIG. 8 may be the same as the method illustrated by FIGS. 3-5. While FIG. 8 illustrates one or more wire bonds formed between the plurality of die directly coupled to the substrate 76 as well as wire bonds formed between the die directly coupled to the substrate 76 and the side of the lead frame opposite the side of the lead frame including the die attach pads, in other implementations no wire bonds may be formed until after the clamp is applied to the lead frame. Similarly, in various implementations the die may be attached to the substrate and/or die attach pads of the lead frame after the lead frame is clamped, as illustrated by FIGS. 9 and 10 (and 14 and 15).

Referring to FIG. 9, a top view of a bottom clamp placed under the lead frame of FIG. 8 is illustrated. Similar to other lead frames illustrated here in, the lead frame of FIGS. 8 through 11 is also illustrated as transparent in order to understand other elements of the method illustrated by FIGS. 8 through 11. In various implementations, a bottom clamp 100 may be configured to directly contact the lead posts 92 but not directly contact the die attach pads 86. In various implementations, the bottom clamp 100 may also be configured to contact the bottom of the substrate 76. The bottom clamp 100 may be configured to approach the lead frame 80 and substrate 76 in a direction perpendicular to the bottom surface of the lead frame 80 and substrate 76. As illustrated by FIG. 9, the tie bar 102 directly coupled to the lead frame in between the two die attach pads may sufficiently support the die attach pads 86 during the formation of the semiconductor package. In various implementations, the tie bar 102 may also reduce lead frame bouncing during formation of the semiconductor package. In various implementations, the hardness of the material of the tie bar 102 may be sufficient to support and/or reduce lead frame bouncing during formation of the semiconductor package.

Figure 11:
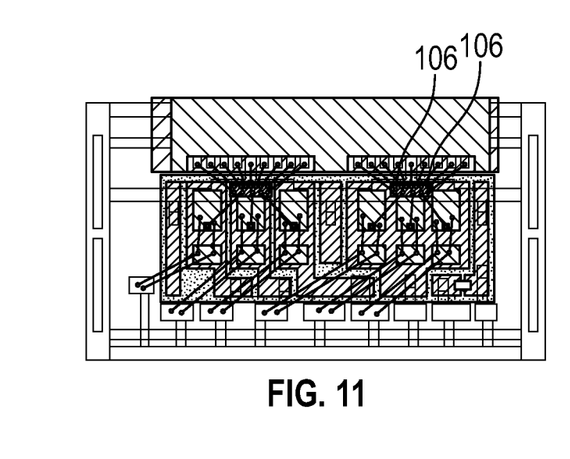
FIG. 11 is a top view of wire bonds formed between the lead frame and the plurality of die of FIG. 10.

Referring to FIG. 10, a top view of a top clamp placed over the lead frame of FIG. 9 is illustrated. As illustrated by FIG. 10, the method may include placing a top clamp 104 over the lead posts 92 of the lead frame. Referring to FIG. 11, a top view of wire bonds formed between the lead frame and the plurality of die of FIG. 10 is illustrated. Once the lead frame is secured between the top clamp 104 and the bottom clamp 100, the method may include forming one or more wire bonds or any other type of electrical connection disclosed herein between any die coupled on the one or more die attach pads and the lead frame 80.

Figure 12:
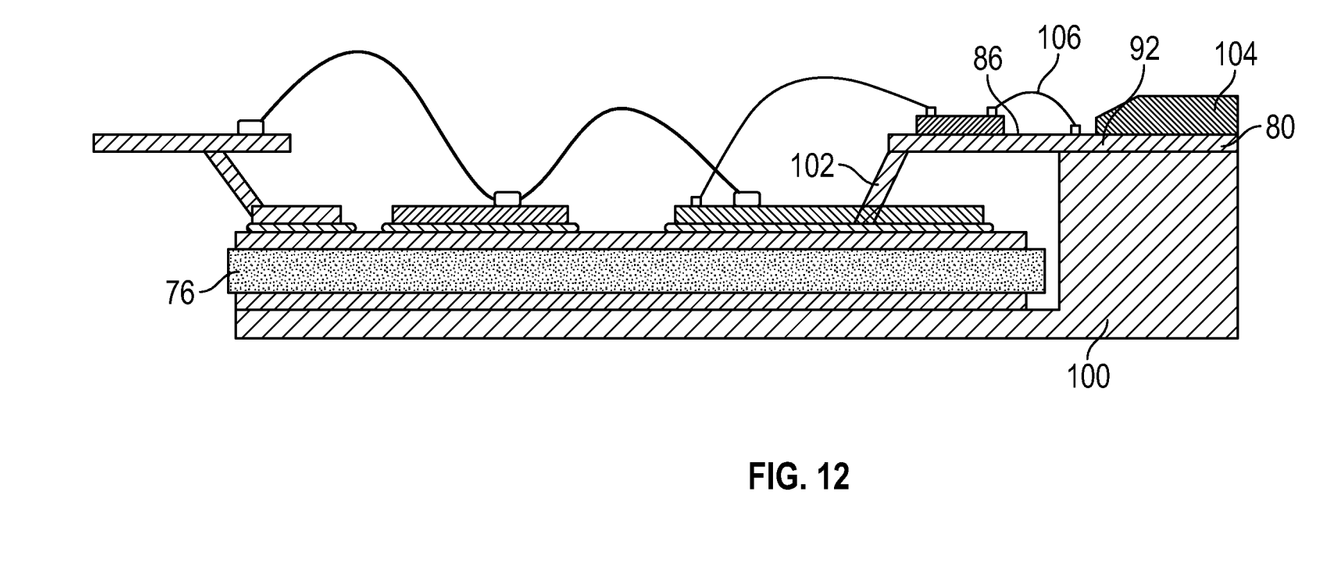
FIG. 12 is a cross sectional side view of the lead frame, substrate, and plurality of die of FIG. 11.

Referring to FIG. 12, a cross-sectional side view of the lead frame, substrate, and plurality of die of FIG. 11 is illustrated. As illustrated by FIG. 12, the lead posts 92 of the lead frame 80 are secured between the top clamp 104 and the bottom clamp 100. The tie bar 102 may provide support needed for the die attach pads and may reduce lead frame bouncing during formation of the semiconductor package.

Figure 13:
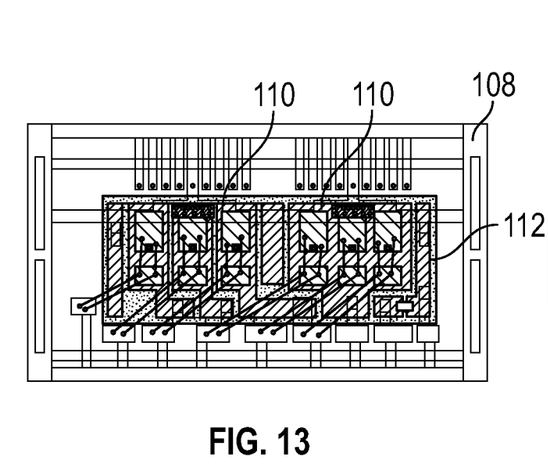
FIG. 13 is a top view of an illustration of another implementation of a lead frame coupled over a substrate.

Referring to FIGS. 13 through 16, a method of forming wire bonds between another implementation of a lead frame and one or more die is illustrated. Referring to FIG. 13, a top view of another implementation of a lead frame coupled over a substrate is illustrated. FIG. 13 is essentially the same as FIG. 8 with the only difference being that the lead frame 108 of FIG. 13 does not include a tie bar directly between the substrate and the lead frame between the first and second die attach pads 110. In such implementations, by not including the tie bar directly coupled to the substrate and the lead frame between the die attach pads, additional space on the substrate may be utilized (for example, by supporting larger die) rather than the space being occupied by the tie bar. Accordingly, the method of obtaining the lead frame 108 coupled over the substrate 112 may be the same as the method associated with FIG. 8.

Figure 14:
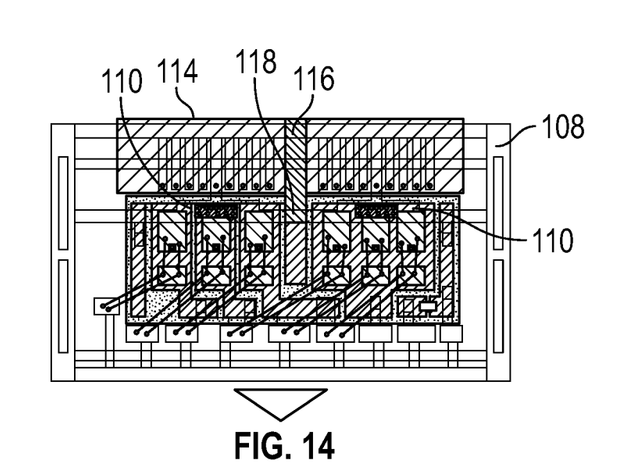
FIG. 14 is a top view of a bottom clamp placed under the lead frame of FIG. 13.

Referring to FIG. 14, a top view of a bottom clamp placed under the lead frame of FIG. 13 is illustrated. In various implementations the method may include coupling a bottom clamp 114 to the lead frame 108. The bottom clamp 114 may be the same as the bottom clamp 100 of FIG. 9. In various implementations, the method may also include coupling a second bottom clamp 116 to the lead frame 108. More specifically, the second bottom clamp 116 may be configured to directly contact the portion 118 of the lead frame 108 between the die attach pads 110. The second bottom clamp 116 may be configured to move in a direction parallel to a bottom surface of the lead frame 108 and the substrate 112. In this manner the second bottom clamp 116 is capable of directly contacting the bottom of the portion 118 between the die attach pads 110 and the substrate 112. While the second bottom clamp 116 is illustrated as directly contacting a portion of the lead frame between the die attach pads 110, in other implementations the second bottom clamp may be configured to directly contact the bottom of one or more die attach pads 110. As illustrated by FIG. 14, in various implementations the method of forming the semiconductor package may include utilizing both the bottom clamp 114 and the second bottom clamp 116. In other implementations the method of forming the semiconductor package may include only utilizing the second bottom clamp 116 and not the bottom clamp 114. In various implementations, the second bottom clamp 116 may reduce lead frame bouncing during formation of the semiconductor package. Further, the second bottom clamp 116 may offer the necessary support to the lead frame (including the die attach pads) inasmuch as the lead frame 108 of FIGS. 13 through 16 does not include a tie bar coupled between the substrate and the portion of the lead frame between the two die attach pads 110.

Figure 15:
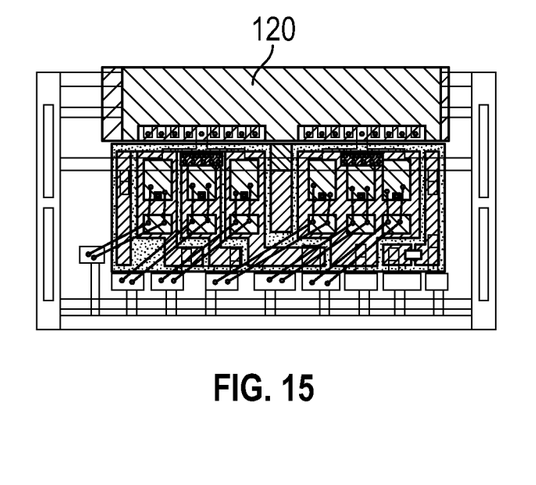
FIG. 15 is a top view of a top clamp placed over the lead frame of FIG. 14.

Referring to FIG. 15 a top view of a top clamp placed over the lead frame of FIG. 14 is illustrated. The top clamp 120, along with the method of utilizing the top clamp 120, may be the same as or similar to top clamp 104 and the method of using the top clamp 104 of FIG. 10.

Figure 16:
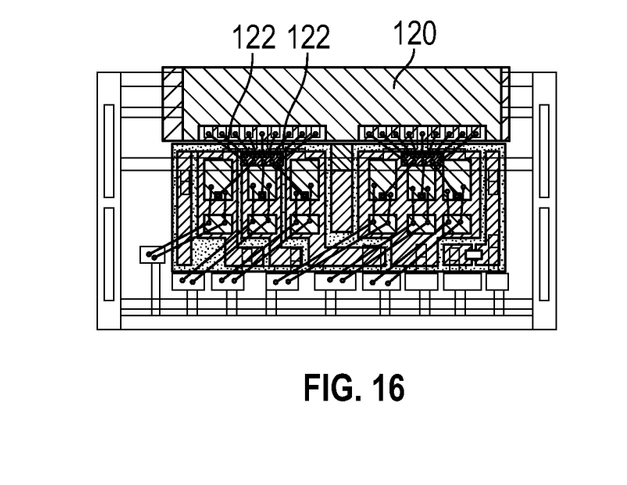
FIG. 16 is a top view of wire bonds formed between the lead frame and the plurality of die of FIG. 15.

Referring to FIG. 16, a top view of wire bonds formed between the lead frame and the plurality of die of FIG. 15 is illustrated. Once the lead frame 108 is secured between the top clamp 120 and the bottom clamps 114 and/or 116, the method may include forming one or more wire bonds 122 or any other type of electrical connection disclosed herein between any die coupled on the one or more die attach pads and the lead frame.

Figure 17:
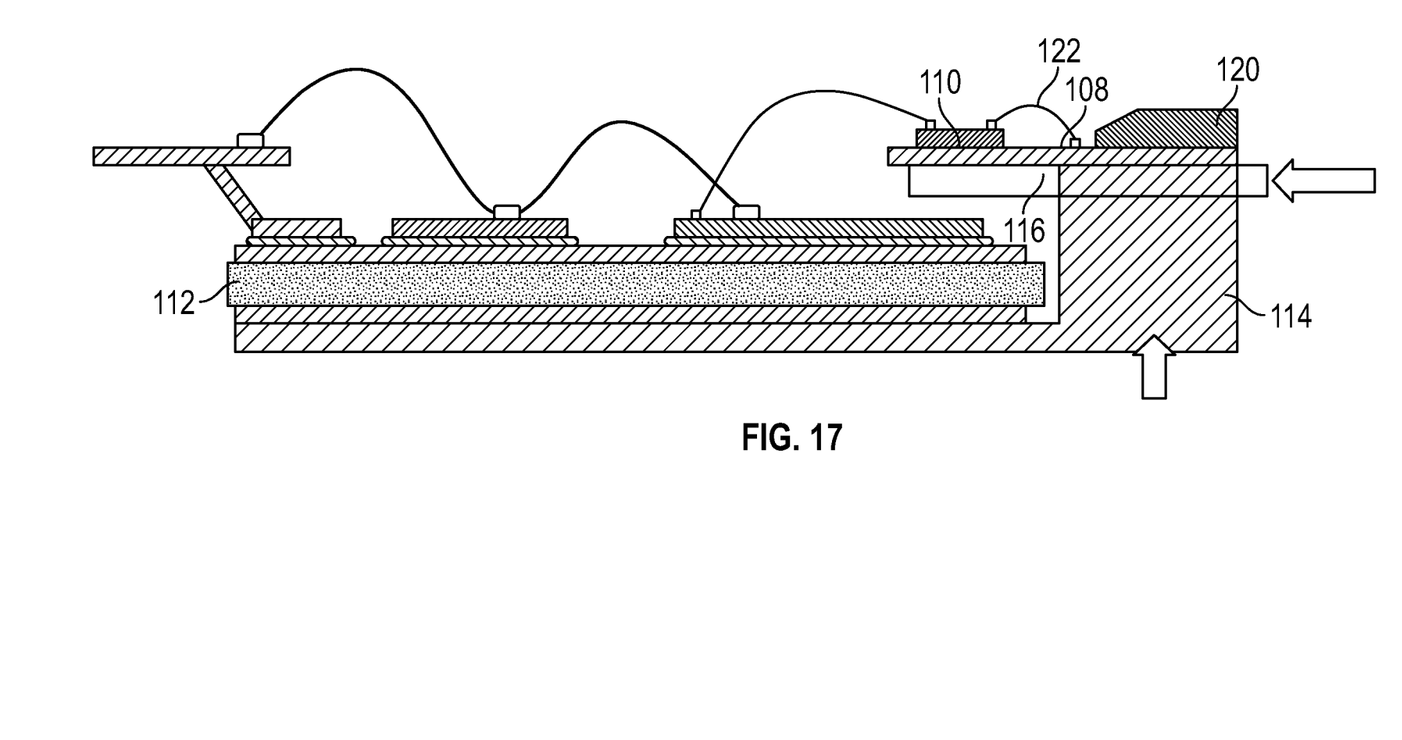
FIG. 17 is a cross sectional side view of the lead frame, substrate, and plurality of die of FIG. 16.

Referring to FIG. 17, a cross-sectional side view of the lead frame substrate and plurality of die of FIG. 16 is illustrated. As illustrated by FIG. 17, the second bottom clamp 116 extends directly under and is configured to contact the bottom of the die attach pad 110. In turn, the second bottom clamp 116 sufficiently supports the die attach pads 110 and any die coupled thereon.

The implementations of the semiconductor packages disclosed herein and the methods of making the same may result in semiconductor packages having reduced sizes inasmuch as the semiconductor packages include overlapping die and a lead frame that overlaps the substrate. Further, the implementations of the semiconductor packages disclosed herein and methods of making the same may result in semiconductor packages having increased performance, including any of a higher current rating and/or a higher power density. This is a result of the ability to have an increased substrate and die thereon without increasing the overall footprint of the semiconductor package due to the overlapping die and the lead frame overlapping the substrate. Still further, due to the increased size of the substrate due to the overlapping die attach pads and lead frame, the various implementations of semiconductor packages disclosed herein may result in a minimized thermal mismatch.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   a substrate;
   a first die coupled on the substrate;
   a lead frame coupled over the substrate, the lead frame comprising a die attach pad; and
   a second die coupled on the die attach pad;
   wherein the second die overlaps the first die; and
   wherein the first die is wire bonded to the second die.

2. The semiconductor package of claim 1, wherein the die attach pad is coupled directly over the substrate.

3. The semiconductor package of claim 1, further comprising a third die coupled on the substrate.

4. The semiconductor package of claim 3, wherein the first die and the third die are power die and the second die is an integrated circuit die.

5. The semiconductor package of claim 1, further comprising a wire bond between the second die and the lead frame.

6. The semiconductor package of claim 1, wherein a portion of the second die extends beyond a perimeter of first die.

7. The semiconductor package of claim 1, wherein at least half of the first die extends beyond a perimeter of the die attach pad.

8. The semiconductor package of claim 1, wherein the first die is directly coupled to the substrate through an adhesive.

9. A semiconductor package comprising:
   a substrate;
   a first die comprising a first side and a second side opposite the first side, the first side coupled to and facing the substrate;
   a third die coupled to the substrate;
   a lead frame coupled over the substrate, the lead frame comprising a die attach pad;
   at least two tie bars coupled between the lead frame and the substrate;
   a second die coupled on the die attach pad and over the second side of the first die; and
   a mold compound encapsulating the first die, the second die, and the third die;
   wherein the second die overlaps the first die; and
   wherein the second die is configured to wire bond to the first die.

10. The semiconductor package of claim 9, wherein the mold compound is between the second side of the first die and the second die.

11. The semiconductor package of claim 10, further comprising a third wire bond between the first die and the third die and between the third die and the lead frame.

12. The semiconductor package of claim 9, further comprising the second die and a second wire bond between the second die and the lead frame.

13. The semiconductor package of claim 9, further comprising a third tie bar coupled between the lead frame and the substrate, wherein the at least two tie bars, the third tie bar, and the die attach pad are all directly coupled to a same side of the lead frame.

14. The semiconductor package of claim 9, further comprising a fifth die overlapping a fourth die.

15. The semiconductor package of claim 9, wherein a portion of the second die extends beyond a perimeter of first die.

16. The semiconductor package of claim 9, wherein at least half of the first die extends beyond a perimeter of the die attach pad.

17. The semiconductor package of claim 9, wherein the first die is directly coupled to the substrate through an adhesive.

18. The semiconductor package of claim 9, wherein the at least two tie bars are directly coupled to the substrate through an adhesive.

\* \* \* \* \*

UNITED STATES PATENT AND TRADEMARK OFFICE
CERTIFICATE OF CORRECTION

PATENT NO. : 11,652,030 B2
APPLICATION NO. : 17/136340
DATED : May 16, 2023
INVENTOR(S) : Jonghwan Baek et al.

It is certified that error appears in the above-identified patent and that said Letters Patent is hereby corrected as shown below:

In the Claims

Column 11, Line 5, Claim 12, delete "the second die and"

Signed and Sealed this
Seventeenth Day of October, 2023

Katherine Kelly Vidal
*Director of the United States Patent and Trademark Office*